(12) United States Patent
Singh et al.

(10) Patent No.: US 12,072,731 B2
(45) Date of Patent: Aug. 27, 2024

(54) TECHNIQUE FOR CLOCK ALIGNMENT SUPPORTING RESET ISOLATION

(71) Applicant: TEXAS INSTRUMENTS INCORPORATED, Dallas, TX (US)

(72) Inventors: Varun Singh, McKinney, TX (US); Rejitha Nair, Southlake, TX (US); John Chrysostom Apostol, Richardson, TX (US); Venkateswar Reddy Kowkutla, Allen, TX (US); Santhanagopal Raghavendra, Dallas, TX (US)

(73) Assignee: TEXAS INSTRUMENTS INCORPORATED, Dallas, TX (US)

( * ) Notice: Subject to any disclaimer, the term of this patent is extended or adjusted under 35 U.S.C. 154(b) by 0 days.

(21) Appl. No.: 18/317,190

(22) Filed: May 15, 2023

(65) Prior Publication Data

US 2023/0280784 A1    Sep. 7, 2023

Related U.S. Application Data

(63) Continuation of application No. 17/537,150, filed on Nov. 29, 2021, now Pat. No. 11,662,763.

(51) Int. Cl.
| | |
|---|---|
| G06F 1/12 | (2006.01) |
| G06F 1/08 | (2006.01) |
| G06F 1/10 | (2006.01) |
| H03K 21/08 | (2006.01) |
| H03K 19/20 | (2006.01) |

(52) U.S. Cl.
CPC .................. *G06F 1/12* (2013.01); *G06F 1/08* (2013.01); *G06F 1/10* (2013.01); *H03K 21/08* (2013.01); *H03K 19/20* (2013.01)

(58) Field of Classification Search
None
See application file for complete search history.

(56) References Cited

U.S. PATENT DOCUMENTS

2007/0257710 A1 * 11/2007 Mari .................. G06F 1/08
327/99

FOREIGN PATENT DOCUMENTS

EP          3200042 B1    2/2019

* cited by examiner

*Primary Examiner* — Cassandra F Cox
(74) *Attorney, Agent, or Firm* — Michael T. Gabrik; Frank D. Cimino (57) ABSTRACT

An electronic device comprising one or more subcircuits configured to receive a clock signal, the clock signal configured to switch from a reference clock signal to a second clock signal based on a clock bypass signal, a timer configured to receive the reference clock signal and output an alignment signal based on the reference clock signal, wherein a frequency of the alignment signal is determined based on clock frequencies of the one or more subcircuits; a clock alignment module coupled to the timer and the one or more subcircuits and configured to receive the clock bypass signal, determine that the clock bypass signal has changed to switch the one or more subcircuits to the reference clock signal from the second clock signal, block the clock signal from being received by the one or more subcircuits, receive the alignment signal, and unblock the clock signal based on the alignment signal.

19 Claims, 5 Drawing Sheets

TECHNIQUE FOR CLOCK ALIGNMENT SUPPORTING RESET ISOLATION

CROSS-REFERENCE TO RELATED APPLICATIONS

This application is a continuation of U.S. patent application Ser. No. 17/537,150, filed Nov. 29, 2021, which is incorporated by reference herein in its entirety.

BACKGROUND

Many complex integrated circuit (IC) systems, such as a microcontroller, embedded circuits, system on a chip (SoC), etc., may include many peripherals which can perform many different functions. These peripherals, also sometimes referred to as blocks, intellectual property (IP) blocks, etc., may provide various functionality, including connectivity, services, and/or interfaces for a processor. Examples of peripherals include, but are not limited to, universal serial bus (USB), multimedia card (MMC), display connectivity, timers, analog to digital converters, graphics processing unit or other image processing hardware, sensors, PCI express (PCIe) interface, etc. In some cases, a processor and a number of peripherals may be integrated together on a single chip, for example, on a SoC.

To help enhance system performance and/or reduce costs and complexity of IC systems, the IC systems may use a synchronized architecture where clocks of the IC system are phase aligned, typically based on a reference clock. This reference clock may be implemented as a phase locked loop (PLL) generating a periodic signal, and multiple, if not all, peripherals of the IC system may be phase aligned with the reference clock. In some cases, such as when one or more peripherals of the IC system are reset, the peripherals can lose this alignment. Techniques for regaining this alignment may be useful for meeting system performance requirements and synchronous systems.

SUMMARY

This disclosure relates to an electronic device, including one or more subcircuits configured to receive a clock signal, the clock signal configured to switch from a reference clock signal to a second clock signal based on a clock bypass signal. The electronic device also includes a timer configured to receive the reference clock signal and output an alignment signal based on the reference clock signal, wherein a frequency of the alignment signal is determined based on clock frequencies of the one or more subcircuits. The electronic device also includes a clock alignment module coupled to the timer and the one or more subcircuits, wherein the clock alignment module is configured to receive the clock bypass signal. The clock alignment module is also configured to determine that the clock bypass signal has changed to switch the one or more subcircuits to the reference clock signal from the second clock signal. The clock alignment module is further configured to block the clock signal from being received by the one or more subcircuits. The clock alignment module is also configured to receive the alignment signal and unblock the clock signal based on the alignment signal.

Another aspect of the present disclosure relates to an electronic circuit configured to receive a reference clock signal. The electronic circuit is further configured to generate an alignment signal based on the reference clock signal, wherein a frequency of the alignment signal is predetermined based on clock frequencies of one or more coupled circuits. The electronic circuit is also configured to receive a clock bypass signal. The electronic circuit is further configured to determine that the clock bypass signal has changed to switch the one or more coupled circuits to the reference clock signal from a second clock signal. The electronic circuit is also configured to output a clock enable signal to block a clock signal from being received by the one or more coupled circuits and unblock the clock signal based on the alignment signal.

Another aspect of the present disclosure relates to a method, including receiving a reference clock signal. The method also includes generating an alignment signal based on the reference clock signal, wherein a frequency of the alignment signal is predetermined based on clock frequencies of one or more coupled circuits. The method further includes receiving a clock bypass signal. The method also includes determining that the clock bypass signal has changed to switch the one or more coupled circuits to the reference clock signal from a second clock signal. The method further includes outputting a clock enable signal to block a clock signal from being received by the one or more coupled circuits. The method also includes unblocking the clock signal based on the alignment signal.

BRIEF DESCRIPTION OF THE DRAWINGS

For a detailed description of various examples, reference will now be made to the accompanying drawings in which.

DETAILED DESCRIPTION

Occasionally, one or more portions of an IC system, such as a peripheral, processor, etc. of a SoC, may experience an issue such as a crash, lock-up, etc. When such an issue occurs, some IC systems may be configured to automatically reboot one or more portions of the IC system without rebooting the entire the IC system (e.g., a warm reset). As an example, a control IC system for an industrial robot or arm may be able to reboot portions of the IC system without rebooting the portion of the IC system controlling the safety systems.

Figure 1:
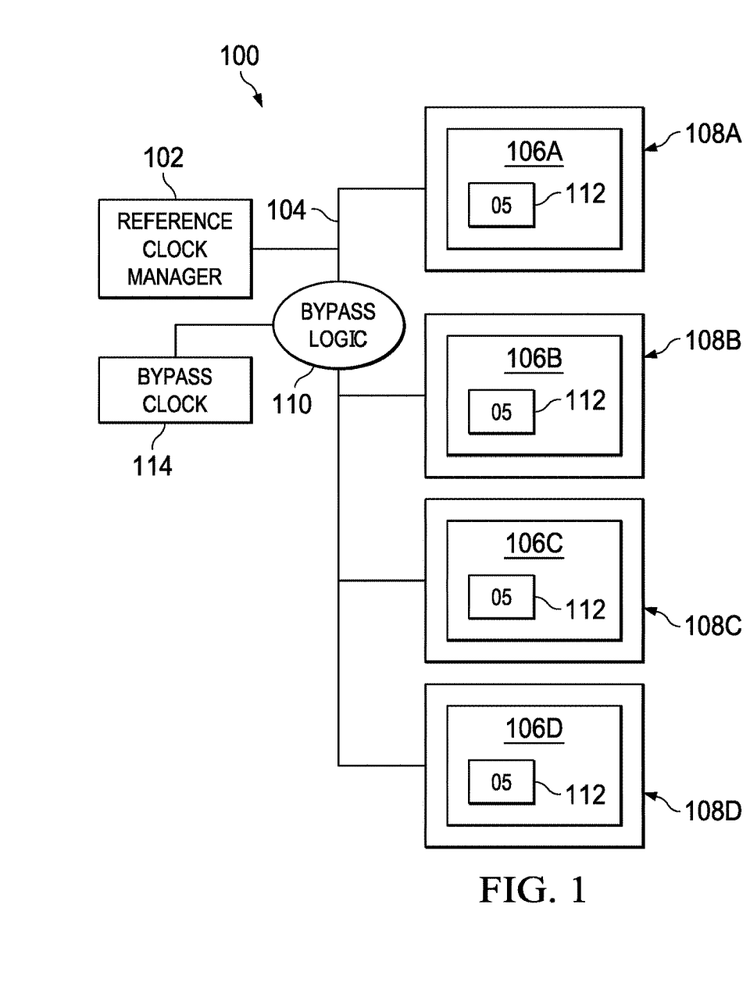
FIG. 1 is a block diagram illustrating a synchronous reset architecture of an IC system, in accordance with aspects of the present disclosure.

FIG. 1 is a block diagram illustrating the synchronous reset architecture 100 of an IC system, in accordance with aspects of the present disclosure. As shown, the synchronous reset architecture 100 includes a reference clock manager 102 coupled to a clock tree 104. The clock tree 104 distributes a clock signal to the components of the IC system. The reference clock manager 102 may include a PLL for generating a clock signal along with circuitry to manage and/or control the clock. The clock tree 104 is coupled to two or more clock dividers 106A-106D (collectively 106) which may be included as a part of subcircuit 108A-108D (collectively 108). Different subcircuits may operate at a different clock frequency from the reference clock, and the clock dividers 106 help convert the reference clock frequency to a frequency compatible with the respective subcircuits. In this example, subcircuits 108 may be a logical portion of the IC system and may include a peripheral along with a clock divider 106. For example, a subcircuit for interfacing with a universal serial bus (USB) may operate at a lower clock frequency than the reference clock frequency and a clock divider may be used to downclock the reference clock to the lower clock frequency. It should be understood that while subcircuits 108 are shown including the clock dividers 106, the clock dividers 106 may be implemented as a part of another component and/or implemented independent of another component. The clock dividers 106 each include a local divider counter 112. The local divider counters 112 help synchronize clock dividers 106 with the reference clock, and the local divider counters 112 are aligned such that they have the same counter value. The local divider counters 112 may be incremented each tick of the clock signal until a maximum value is reached and the divider counters 112 may be reset. For example, the clock signal may have a maximum value of 32, and the divider counters 112 may count from 0 to 32 on each clock tick and then reset to 0 after 32. As shown, the value of the local divider counters 112 are aligned (here, the value is 05).

In some cases, bypass logic 110 may be coupled along the clock tree 104 such that the bypass logic 110 is placed between the reference clock manager 102 and one or more of the subcircuits 108. In this example, the bypass logic 110 is coupled between the reference clock manager 102 and subcircuits 108B-108D. The bypass logic 110 may be used to provide a bypass clock signal to IC components, such as subcircuits 108B-108D that are coupled to the reference clock manager 102 via the bypass logic 110. The bypass logic 110 may be switched such that the reference clock signal is passed to subcircuits coupled to the bypass logic in some cases, and in other cases, the bypass clock signal is passed to the subcircuits. For example, a bypass clock signal that is slower than the reference clock signal may be sent to subcircuits 108B-108D that are coupled to the reference clock manager 102 via the bypass logic 110 when the IC system is performing a warm reset. The bypass clock signal may be provided by a bypass clock 114 coupled to the bypass logic 110. The bypass clock 114 may include a PLL for generating a bypass clock signal. The bypass clock may be separate from the reference clock manager 102, or may be integrated with the reference clock manager 102. For example, the bypass clock may be a downclocked version of the reference clock.

In some cases, certain subcircuits, such as subcircuit 108A, may be excluded (e.g., isolated) from the bypass logic 110. For example, certain subcircuits, such as those performing functionality that cannot be interrupted, like safety systems, may be isolated from warm resets and thus are reset when a warm reset of the IC system is performed.

As the bypass clock is different from the reference clock, the local divider counters 112 of subcircuits 108A that are isolated from the bypass logic 110 may become misaligned with the local divider counters 112 of subcircuits 108B-108D which are coupled to from the bypass logic 110 when the bypass clock signal is provided, such as during a warm reset.

Figure 2:
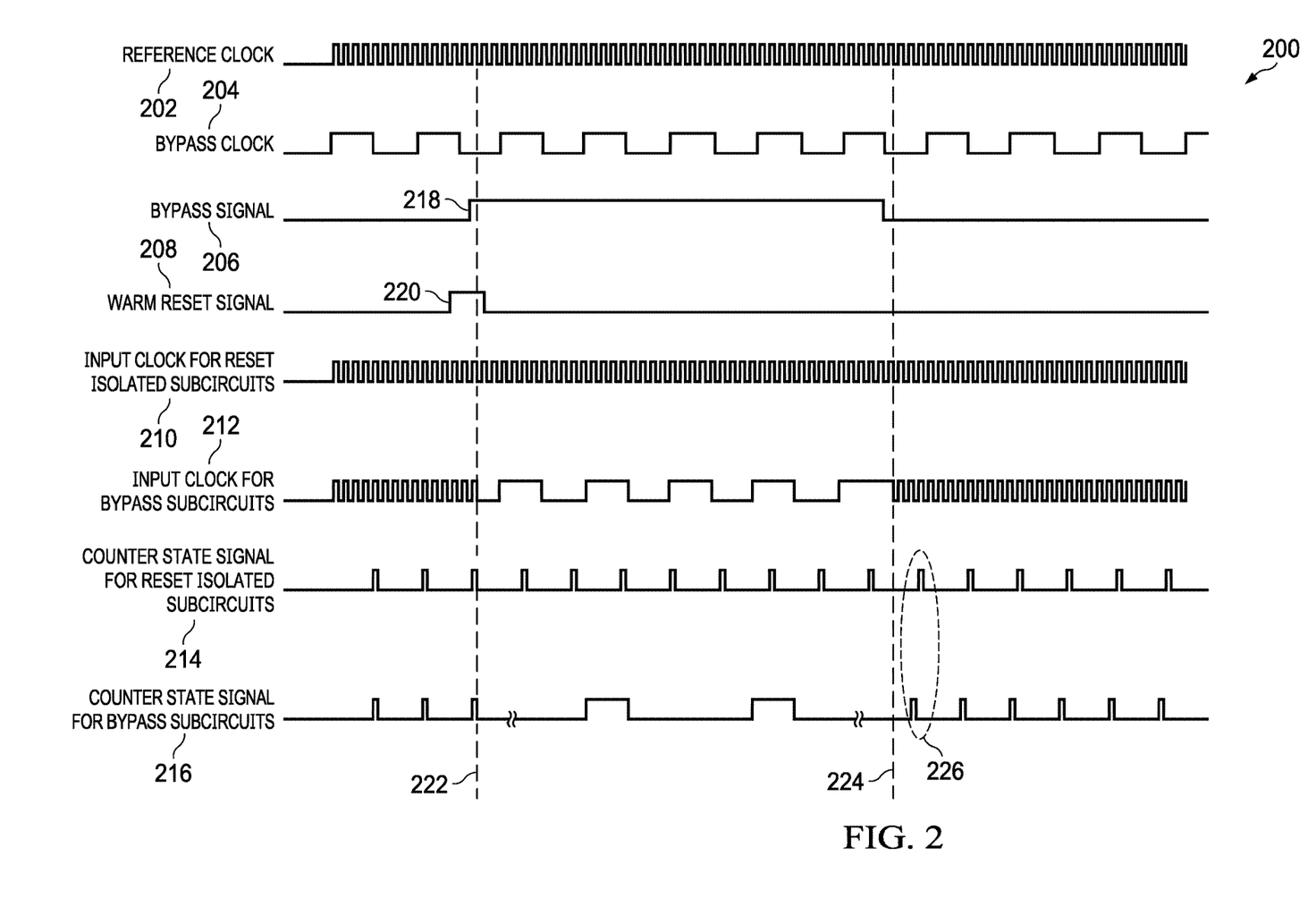
FIG. 2 is a timing diagram illustrating a warm reset, in accordance with aspects of the present disclosure.

FIG. 2 is a timing diagram 200 illustrating a warm reset, in accordance with aspects of the present disclosure. As shown, the timing diagram 200 shows the clock signal of a reference clock 202 as well as the clock signal of a bypass clock 204, a bypass signal 206, a warm reset signal 208, an input clock for reset isolated subcircuits 210, an input clock for bypass subcircuits 212, a counter state signal for reset isolated subcircuits 214, and a counter state signal for bypass subcircuits 216. As shown, the clock signals of the reference clock 202 and bypass clock 204 show the ticks of the respective clocks. In this example, the frequency of the clock signal of the reference clock 202 is higher than the clock signal of the bypass clock 204. The bypass signal 206, when asserted 218, indicates when bypass subcircuits switch from the reference clock 202 to the bypass clock 204. The warm reset signal 208 is asserted 220 to initiate the warm reset process, which occurs between times 222 and 224.

The input clock for reset isolated subcircuits 210 illustrates the clock signal from the clock tree that is received by dividers of subcircuits that are reset isolated (e.g., subcircuit 108A in FIG. 1). In this example, the input clock for reset isolated subcircuits 210 remains at the reference clock 202 frequency. The input clock for bypass subcircuits 212 illustrates the clock signal from the clock tree provided via the bypass logic 110 that is received by dividers of subcircuits which are not reset isolated (e.g., subcircuits 108B-108D in FIG. 1) and thus receive the clock signal from the bypass clock 204 while the bypass signal 206 is asserted 218. As shown, the input clock for bypass subcircuits 212 aligns with the reference clock 202 until time 222 when the bypass signal 206 is asserted 218. When the bypass signal 206 is asserted 218, the input clock for bypass subcircuits 212 is aligned with the bypass clock 204. When the bypass signal 206 is de-asserted at time 224, the input clock for bypass subcircuits 212 provided via the bypass logic 110 reverts to the reference clock 202.

In some cases, a counter state signal may be asserted by the divider of a respective subcircuit when the divider counters are reset. As shown, prior to time 222, the counter state signal for reset isolated subcircuits 214 and the counter state signal for the bypass subcircuits 216 are phase aligned with each other to help allow the subcircuits to communicate with each other. As the counter state signal for the bypass subcircuits are a function of the input clock, after time 222 the input clock for bypass subcircuits 212 is aligned with the bypass clock 204 and a frequency of the counter state signal for bypass subcircuits 216 is reduced as a function of the bypass clock 204. When the bypass signal 206 is de-asserted, the counter state signal for bypass subcircuits 216 returns to its previous frequency (prior to time 222) as a function of the reference clock 202. However, exactly when the input clock for bypass subcircuits 216 reverts to the reference clock 202 after time 224 may be nondeterministic, and the counter state signal for reset isolated subcircuits 214 and the counter state signal for the bypass subcircuits may become misaligned 226. According to aspects of the present disclosure, this misalignment may be addressed by adding a clock aligner module.

Figure 3:
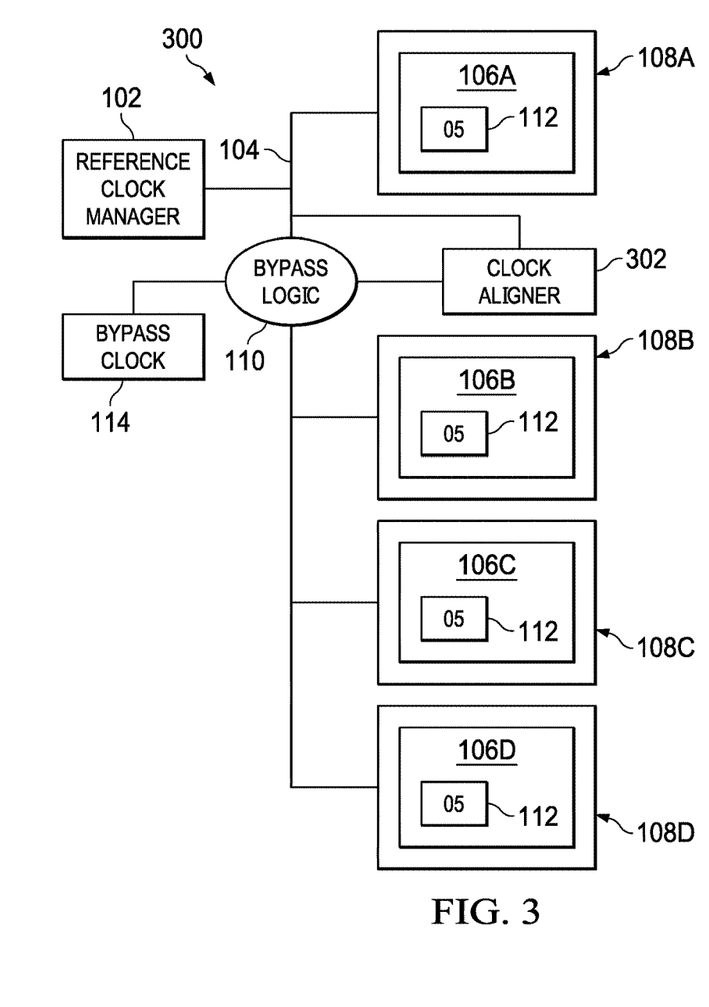
FIG. 3 is a block diagram illustrating a clock aligned synchronous reset architecture of an IC system, in accordance with aspects of the present disclosure.

FIG. 3 is a block diagram of illustrating a clock aligned synchronous reset architecture 300 of an IC system, in accordance with aspects of the present disclosure. In this example, the clock aligned synchronous reset architecture 300 builds on the synchronous reset architecture 100 of FIG. 1. As shown, a clock aligner module 302 may be coupled to the reference clock manager 102 via the clock tree 104 and receive the reference clock signal from the reference clock. The clock aligner module 302 may also be coupled to the bypass logic 110 and through the bypass logic 110 to the clock dividers 106 of the subcircuits which are not reset isolated (e.g., subcircuits 108B-108D).

Figure 4:
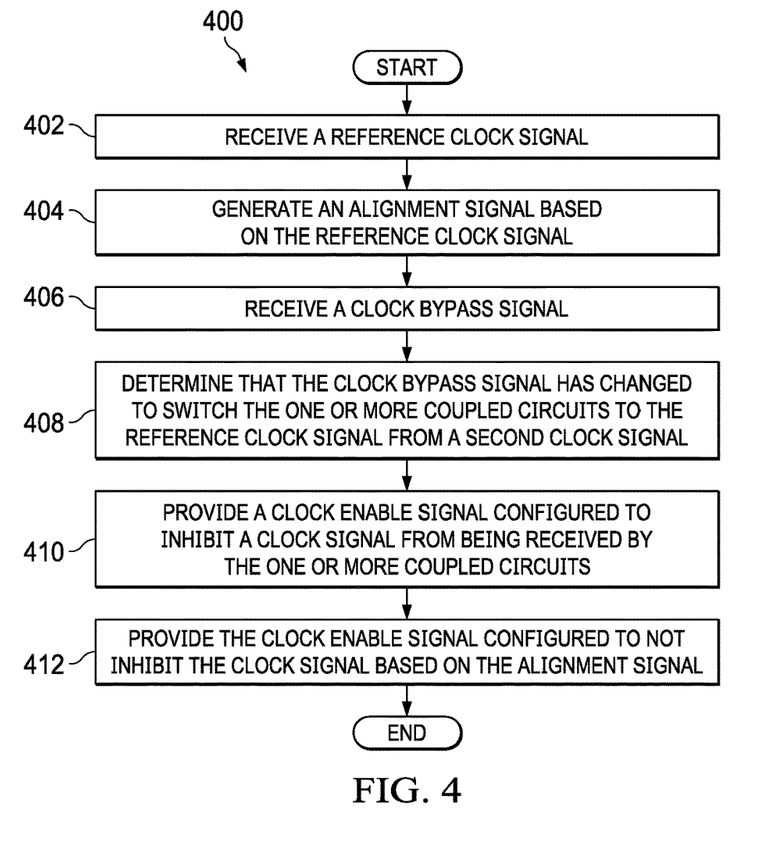
FIG. 4 is a flow diagram illustrating a technique for clock divider alignment, in accordance with aspects of the present disclosure.

FIG. 4 is a flow diagram illustrating a technique for clock divider alignment 400, in accordance with aspects of the present disclosure. At block 402, a reference clock signal is received. For example, a reference clock signal may be used by clock dividers of subcircuits to generate subcircuit specific clock signals. The reference clock signal may also be used to synchronize the components of the electronic device. The reference clock signal may be received by a clock aligner. At block 404, a clock aligner generates an alignment signal based on the reference clock signal. A frequency of the alignment signal is predetermined based on clock frequencies of one or more coupled circuits. In some cases, the alignment signal is predetermined based on a least common multiplier (LCM) of the clock frequencies of the subcircuit specific clock signals. For example, if the subcircuit operate at 500 MHz, 200 MHz, and 1 GHz, the alignment signal may be predetermined as 100 MHz as that frequency is the LCM of the subcircuit clock frequencies. At block 406, a clock bypass signal is received. For example, the clock aligner module may receive a clock bypass signal. The clock bypass signal may be used to switch the subcircuits from the reference clock signal to a bypass clock signal. The clock bypass signal may be received by the clock aligner module and the clock bypass signal may be set, for example, by a processor, reset module, or other component when a reset, or other similar action (e.g., entering a low power mode, etc.) for the bypass circuits is to be performed. In some cases, the bypass clock signal may be a lower frequency clock signal compared to the reference clock signal. This lower frequency clock signal may help reduce current draw, for example, during a reset. In some cases, the bypass clock signal may be generated based on a different clock rather than the reference clock signal.

At block 408, a determination is made that the clock bypass signal has changed to switch the one or more coupled circuits to the reference clock signal from a second clock signal. For example, the clock aligner module may monitor the clock signals going to the bypass subcircuits for an indication that the bypass subcircuits are switching from the bypass clock signal to the reference clock signal. At block 410, a clock enable signal may be provided to inhibit a clock signal from being received by the one or more coupled circuits. For example, the clock signal, either the bypass clock signal or the reference clock signal, may be communicated to the bypass subcircuits via a logic gate. In some cases, the logic gate may be a mux of the bypass logic configured to receive a clock enable signal generated by the clock aligner module. The clock aligner module may, via a clock enable signal, set the logic gate to block (e.g., inhibit) the clock signals and stop the clocks on the bypass subcircuits. At block 412, the clock enable signal is provided to not inhibit the clock signal based on the alignment signal. For example, the alignment signal is generated based on the clock frequencies of one or more coupled circuits (e.g., subcircuits) and may indicate when counters of clock dividers of the coupled circuits should be reset to an initial value. In some cases, the clock aligner module may output a clock divider align reset signal to reset counters of the clock dividers in the coupled circuits. In some cases, the clock signal may be unblocked on a clock tick before the alignment signal is expected to help synchronize the coupled circuits on the alignment signal.

Figure 5:
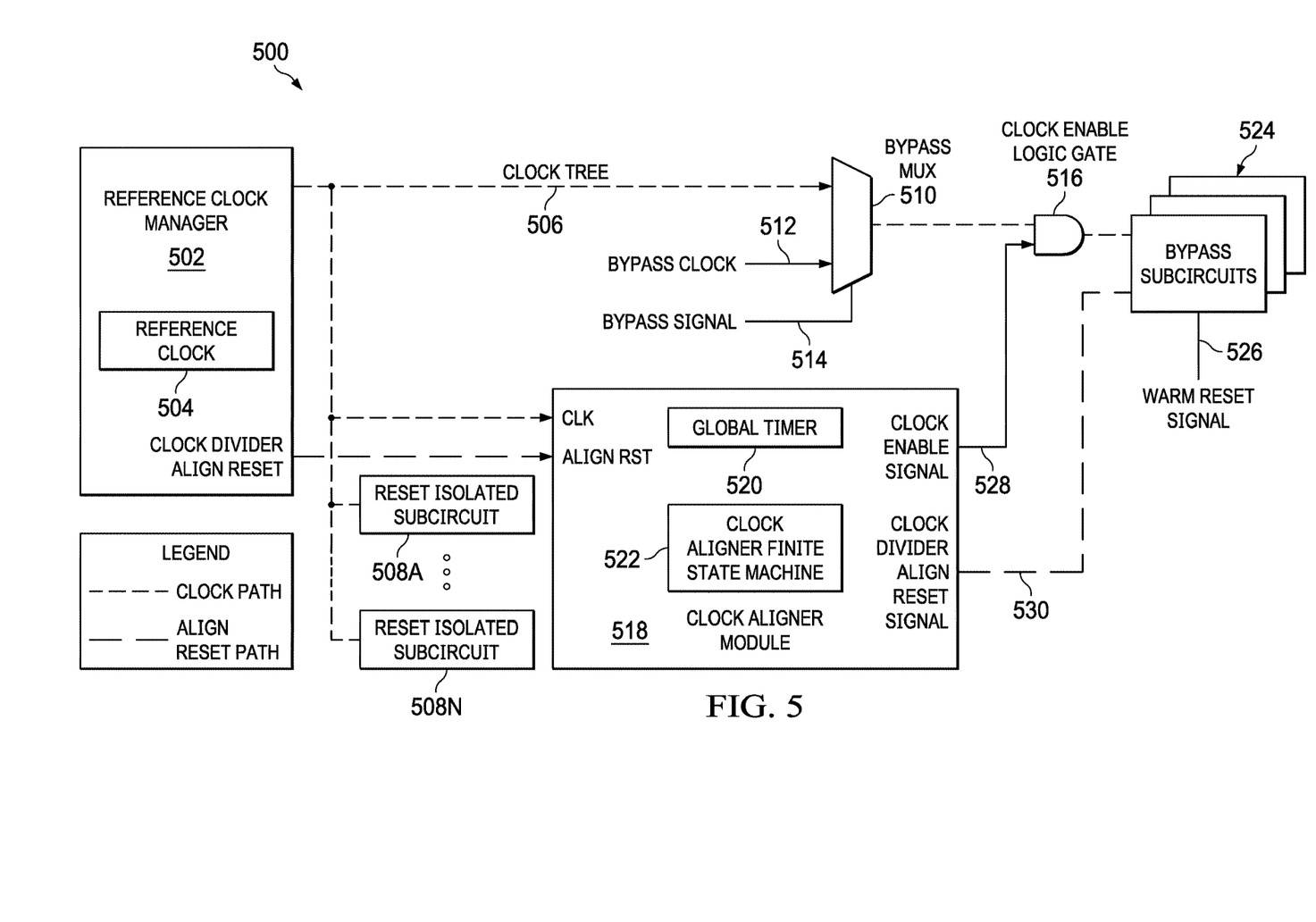
FIG. 5 is a block diagram illustrating a clock alignment module, in accordance with aspects of the present disclosure.

FIG. 5 is a block diagram 500 illustrating a clock alignment module, in accordance with aspects of the present disclosure. In this example, a reference clock manager 502 may be coupled and transmit a reference clock 504 via a clock tree 506. The reference clock manager 502 may be coupled, via the clock tree 506, to one or more reset isolated subcircuits 508A . . . 508N (collectively 508), and the one or more reset isolated subcircuits 508 may receive the reference clock 504.

The reference clock manager 502 is coupled to an input line of a bypass mux 510 to provide the reference clock 504 via the clock tree 506 to the bypass mux 510. In some cases, the bypass mux 510 may be included as a part of the bypass logic 532. In some cases, the bypass logic 532 may correspond to bypass logic 110 of FIG. 3. The bypass clock 512 is also coupled on another input line to the bypass mux 510, and the bypass mux 510 may be configured to select between the reference clock 504 and the bypass clock 512 based on a bypass signal 514 coupled on the select line of the bypass mux 510. When a warm reboot is initiated, for example, by other IC system components not shown in FIG. 5, the bypass signal 514 may be asserted and the bypass clock 512 is selected instead of the reference clock 504 by the bypass mux 510. This bypass clock 512 and reference clock 504 may be output to the bypass subcircuits 524 via a clock enable logic gate 516 of the bypass logic 532. The bypass subcircuits 524 may also receive a warm reset signal 526, causing the bypass subcircuits 524 to perform a warm reset procedure.

The reference clock manager 502 is also coupled to and sends the reference clock 504 to a clock aligner module 518. The clock aligner module 518 may correspond to clock aligner 302 of FIG. 3. The clock aligner module includes a global timer 520 and a clock aligner finite state machine (FSM) 522. The global timer 520 may be a counter which may assert an alignment pulse (e.g., signal) every $n^{th}$ clock tick of the reference clock 504. In some cases, n may be a least common multiplier of the clock rates of all of the subcircuits coupled to clock aligner module 518.

The reference clock manager 502 may also send a clock divider align reset signal 530 to the clock aligner module 518. The clock aligner FSM 522 may receive the clock divider align reset signal 530 and the alignment pulses from the global timer 520. The clock divider align reset signal 530 may indicate when a warm reboot procedure has been completed, and the bypass subcircuits 524 should be aligned with the reference clock 504 and other reset isolated subcircuits 508. The clock aligner FSM 522 may stop the clocks of the bypass subcircuits based on the received clock divider align reset signal 526. For example, when the clock aligner FSM 522 receives the indication that the warm reboot procedure has been completed and the bypass subcircuits 524 should be aligned with the reference clock 504 from the clock divider align reset signal 530, the clock aligner FSM 522 may set a clock enable signal 528. The clock aligner FSM 522 may be coupled to the clock enable logic gate 516, and the clock enable signal 528 may be output to the clock enable logic gate 516. The clock enable logic gate 516 may be any suitable logic gate (e.g., AND, OR, NOR, etc.) based on the signal used for the clock enable signal 528 (e.g., logical 0 or 1). Based on the clock enable signal 528, the clock enable logic gate 516 may block the output of the selected clock signal from the bypass mux 510 from being sent to the bypass subcircuits 524, thus stopping the clock to the bypass subcircuits 524. The bypass signal 514 may be de-asserted, and the bypass mux 510 may select the reference clock 504 to output to the clock enable logic gate 516. The clock aligner FSM 522 may wait for an alignment pulse from the global timer 520 and then toggle the clock enable signal 528 such that the clock enable logic gate 516 stops blocking the clock signal from bypass mux 510. The bypass subcircuits 524 may then resume receiving the reference clock 504.

The clock aligner module 518 may also assert a clock divider align reset signal 530 to the bypass subcircuits 524 indicating an initialization value for clock dividers of the bypass subcircuits 524. The initialization values indicate an initial value of the local divider counters of the clock dividers of the bypass subcircuits 524, and the local divider counters may resume counting from the initial values when the reference clock 504 is restored.

Figure 6A:
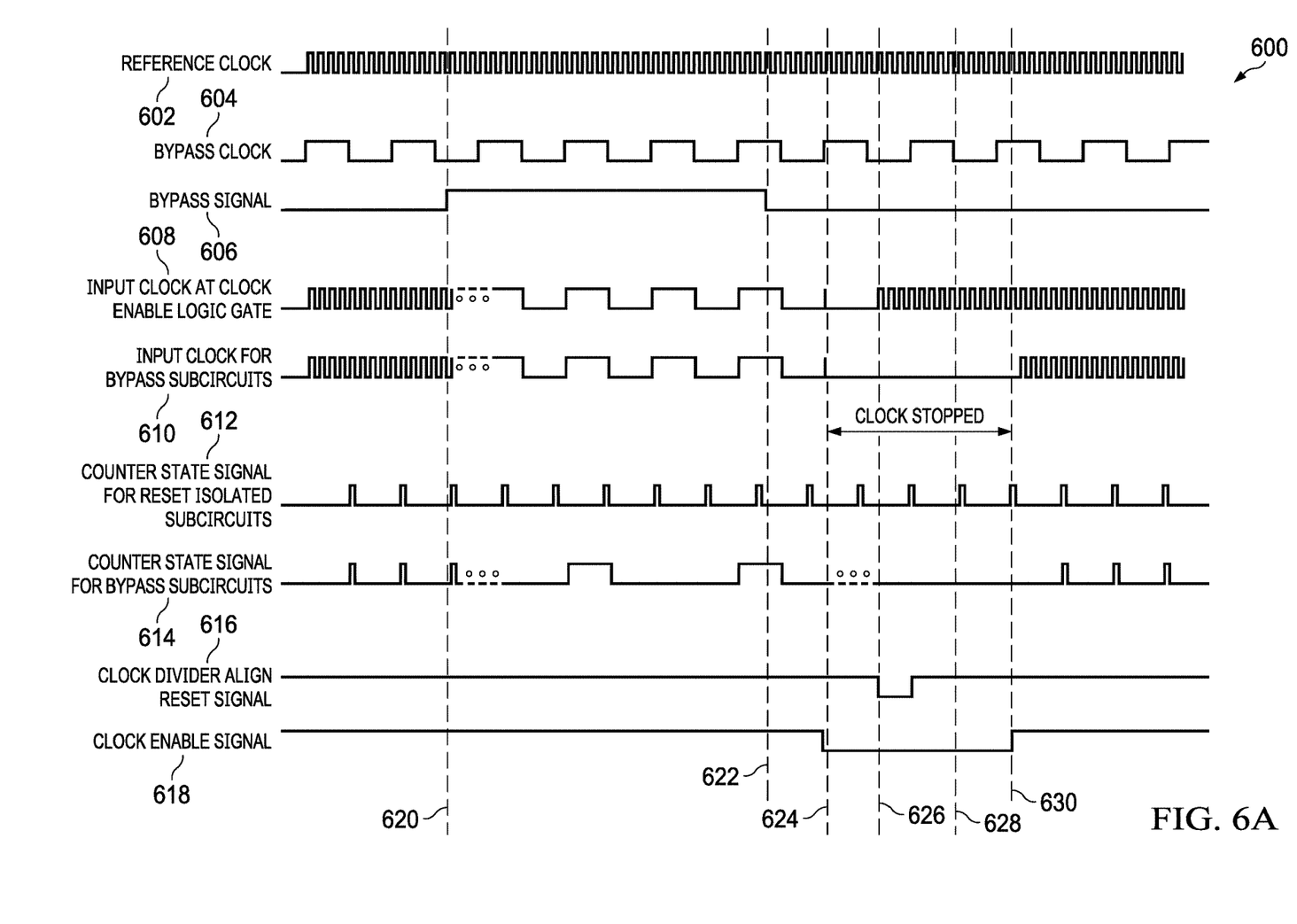
FIG. 6A is a timing diagram illustrating alignment of the clock dividers of the bypass subcircuits, in accordance with aspects of the present disclosure.

FIG. 6A is a timing diagram 600 illustrating alignment of the clock dividers of the bypass subcircuits, in accordance with aspects of the present disclosure. FIG. 6A is discussed in conjunction with FIG. 6B, which is a state diagram 650 illustrating states of the clock aligner FSM 522, in accordance with aspects of the present disclosure. As shown, timing diagram 600 shows a clock signal of a reference clock 602 as well as clock signal of a bypass clock 604, a bypass signal 606, an input clock signal 608 at the clock enable logic gate, an input clock 610 to the bypass subcircuits, a counter state signal 612 for reset isolated subcircuits, a counter state signal 614 for bypass subcircuits, a clock divider align reset signal 616, and a clock enable signal 618.

In this example, the bypass signal 606 is asserted at time 620 as a part of initiating a warm reset procedure. The bypass signal 606 may be received by a bypass mux, such as bypass mux 510, switching the bypass subcircuits from the reference clock 602 to the bypass clock 604. As shown, the input clock 608 at the clock enable logic gate and input clock 610 for bypass subcircuits provided by the clock enable logic gate change from the reference clock 602 frequency to the bypass clock 604 frequency. Similarly, a frequency of the counter state signal 614 for bypass subcircuits becomes based on the bypass clock signal 604 after time 620.

Figure 6B:
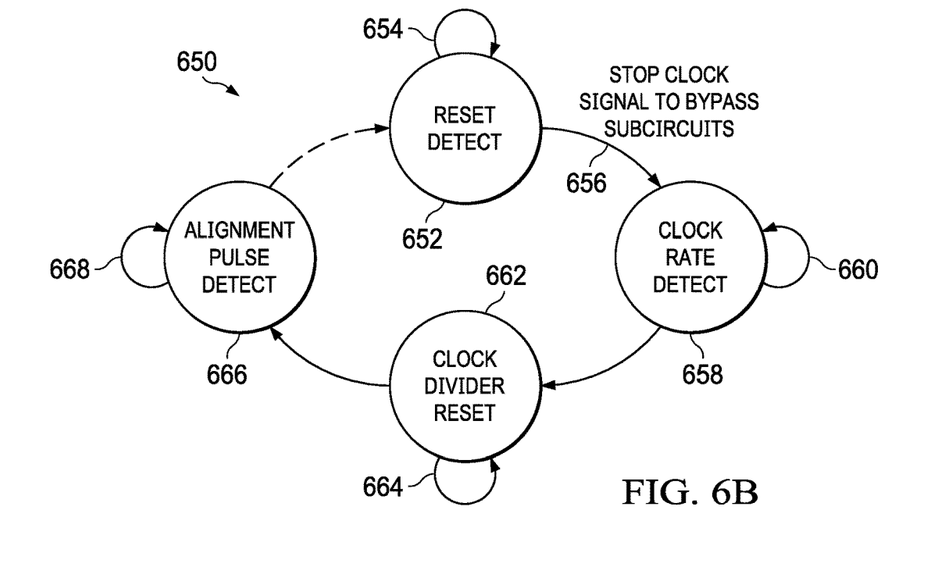
FIG. 6B is a state diagram illustrating states of the clock aligner finite state machine, in accordance with aspects of the present disclosure.

As shown in state diagram 650 of FIG. 6B, the clock aligner FSM, such as clock aligner FSM 522, may start in a reset detection state 652. In the reset detection state 652, the clock aligner FSM waits 654 for the bypass signal 606 to be de-asserted. As a part of recovering from the warm reset procedure, the bypass signal 606 may be de-asserted at time 622. The clock aligner FSM, upon detecting the de-assertion of the bypass signal 606, stops the clock signal to the bypass subcircuits 656, for example, by de-asserting the clock enable signal 618 to cause the clock enable logic gate, such as clock enable logic gate 516, to block (e.g., gate) the clock signal. As shown in timing diagram 600, in some cases, the clock aligner FSM may be synchronized with the bypass clock signal 604 such that the clock enable signal 618 is de-asserted before the next clock tick of the bypass clock signal 604, here at time 624.

The clock aligner FSM may then move into a clock rate detection state 658. In some cases, the clock aligner FSM may receive the input clock 608 at the clock enable logic gate and the clock aligner FSM may detect the input clock from the bypass mux 510. In the clock rate detection state 658, the clock aligner FSM may wait 660 until the reference clock signal 602 is stable at the clock enable logic gate. In this example, the input clock 608 rate at the clock enable logic gate stabilizes on the reference clock signal 602 and is detected at time 626. The clock aligner FSM may then move into clock divider reset state 662.

In the clock divider reset state 662, the clock aligner FSM may assert the clock divider align reset signal 616. In some cases, the clock divider reset state 662 may wait 664 to assert the clock divider align reset signal 616 a number of clock cycles. This number of clock cycles may be based on the reference clock 602 and may be predetermined. In some cases, the clock divider reset state 662 may pulse the clock divider align reset signal 616 a number of times. In some cases, the clock divider reset state 662 may wait 664 an additional number of clock cycles after the clock divider align reset signal 616 has been sent, for example, to allow the clock divider align reset signal 616 to propagate. In some cases, the clock divider align reset signal 616 may indicate to the coupled subcircuits to reset their respective clock dividers to a default or initial value. In this example, the clock aligner FSM may wait 664 until time 628 and then transition to the alignment pulse detection state 666. In the alignment pulse detection state 666, the clock aligner FSM may wait 668 for $n^{th}$ number of pulses of the alignment pulse from the global timer. In some cases, the $n^{th}$ number of pulses may be an LCM of all of the clock dividers of the coupled subcircuits. The clock aligner FSM may then ungate the clock signal to the subcircuits, for example, by asserting the clock enable signal 618 to cause the clock enable logic gate 516 to unblock the clock signal. In some cases, the clock signal may be ungated on a clock cycle of the reference clock prior to the next alignment pulse from the global timer, here at time 630.

In addition to the reset recovery scenario described above, the clock divider alignment techniques may be applicable in any other scenario where circuit components may be switched from asynchronous operations (e.g., operating based on more than one clock) to synchronous operations (e.g., operating based on a single or multiple synchronized clocks). As examples, the above-described clock divider alignment technique may be applicable to scenarios where circuit components may enter a sleep or low/reduced power mode by switching to a slower clock than other circuit components. In some cases, the above-described clock divider alignment technique may allow circuit components to be accessed by multiple other circuit components operating using different clocks. For example, certain circuit components, such as a security module, may be isolated on a separate clock as other circuit components, and the clock divider alignment techniques may be used to synchronize certain circuit components with the security module to allow for synchronous access.

It should be understood that while the description refers to certain signals as being asserted or de-asserted, these terms generally mean that a certain signal may be logically inverted. For example, a logically low signal may be pulled high, a logically high signal may be pulled low, a logical zero signal changed to a logical one, or vice versa.

In this description, the term "couple" may cover connections, communications, or signal paths that enable a functional relationship consistent with this description. For example, if device A generates a signal to control device B to perform an action: (a) in a first example, device A is coupled to device B by direct connection; or (b) in a second example, device A is coupled to device B through intervening component C if intervening component C does not alter the functional relationship between device A and device B, such that device B is controlled by device A via the control signal generated by device A.

A device that is "configured to" perform a task or function may be configured (e.g., programmed and/or hardwired) at a time of manufacturing by a manufacturer to perform the function and/or may be configurable (or re-configurable) by a user after manufacturing to perform the function and/or other additional or alternative functions. The configuring may be through firmware and/or software programming of the device, through a construction and/or layout of hardware components and interconnections of the device, or a combination thereof.

A circuit or device that is described herein as including certain components may instead be adapted to be coupled to those components to form the described circuitry or device. Circuits described herein are reconfigurable to include additional or different components to provide functionality at least partially similar to functionality available prior to the component replacement. Modifications are possible in the described examples, and other examples are possible within the scope of the claims.

What is claimed is:

1. An integrated circuit device comprising:
   a clock selection circuit that includes:
      a first input configured to receive a first clock signal;
      a second input configured to receive a second clock signal;
      a third input configured to receive a selection signal; and
      an output, wherein the clock selection circuit is configured to provide an intermediate clock signal at the output based on either the first clock signal or the second clock signal based on the selection signal;
   a gating circuit that includes:
      a first input coupled to the output of the clock selection circuit;
      a second input; and
      an output configured to provide a third clock signal; and
   an alignment circuit that includes an output coupled to the second input of the gating circuit, wherein the alignment circuit is configured to determine whether to provide an enable signal at the output of the alignment circuit such that the third clock signal is inhibited based on whether the intermediate clock signal transitions between being based on the second clock signal and being based on the first clock signal.

2. The integrated circuit device of claim 1, wherein the alignment circuit is configured to continue to provide the enable signal such that the third clock signal is inhibited until the intermediate clock signal transitions with the first clock signal.

3. An integrated circuit device comprising:
   a clock selection circuit that includes:
      a first input configured to receive a first clock signal;
      a second input configured to receive a second clock signal;
      a third input configured to receive a selection signal; and
      an output wherein the clock selection circuit is configured to provide an intermediate clock signal at the output based on either the first clock signal or the second clock signal based on the selection signal:
   a gating circuit that includes:
      a first input coupled to the output of the clock selection circuit;
      a second input; and
      an output configured to provide a third clock signal; and
   an alignment circuit that includes an output coupled to the second input of the gating circuit, wherein the alignment circuit is configured to determine whether to provide an enable signal at the output of the alignment circuit such that the third clock signal is inhibited based on the selection signal.

4. An integrated circuit device comprising:
   a clock selection circuit
      a first input configured to receive a first clock signal;
      a second input configured to receive a second clock signal;
      a third input configured to receive a selection signal; and
      an output wherein the clock selection circuit is configured to provide an intermediate clock signal at the output based on either the first clock signal or the second clock signal based on the selection signal;
   a gating circuit that includes:
      a first input coupled to the output of the clock selection circuit;
      a second input; and
      an output configured to provide a third clock signal;
   an alignment circuit that includes an output coupled to the second input of the gating circuit, wherein the alignment circuit is configured to provide an enable signal at the output of the alignment circuit that is configured to cause the gating circuit to inhibit the third clock signal;
   a first clock source coupled to the first input of the clock selection circuit;
   a second clock source coupled to the second input of the clock selection circuit; and
   a set of circuits coupled to the gating circuit to receive the third clock signal.

5. The integrated circuit device of claim 4, wherein each circuit of the set of circuit includes a respective local clock divider configured to produce a respective local clock based on the third clock signal.

6. The integrated circuit device of claim 5, wherein:
   the alignment circuit includes a timer circuit configured to produce an alignment pulse at an interval based on the respective local clock of each circuit of the set of circuits; and
   the alignment circuit is configured to:
      determine whether to provide the enable signal such that the third clock signal is inhibited based on whether the intermediate clock signal transitions from being based on the second clock signal to being based on the first clock signal; and
      determine whether to provide the enable signal such that the third clock signal is not inhibited based on the alignment pulse.

7. The integrated circuit device of claim 5, wherein:
   the output of the alignment circuit is a first output;
   the alignment circuit includes a second output coupled to each circuit of the set of circuits; and
   the alignment circuit is configured to determine whether to provide a reset signal at the second output based on whether the intermediate clock signal transitions from being based on the second clock signal to being based on the first clock signal.

8. An integrated circuit device comprising:
   a first clock generator that includes an output configured to provide a first clock signal;
   a second clock generator that includes an output configured to provide a second clock signal;
   a first set of circuits coupled to the output of the first clock generator to receive the first clock signal;

a clock selection circuit that includes:
a first input coupled to the output of the first clock generator;
a second input coupled to the output of the second clock generator;
a third input configured to receive a selection signal; and
an output configured to provide an intermediate clock signal, wherein the clock selection circuit is configured to select, based on the selection signal, between providing an intermediate clock signal based on the first clock signal and providing the intermediate clock signal based on the second clock signal;
a gating circuit that includes:
a first input coupled to the output of the clock selection circuit to receive the intermediate clock signal;
a second input; and
an output configured to provide a third clock signal;
an alignment circuit that includes an output coupled to the second input of the gating circuit, wherein the alignment circuit is configured to provide an enable signal at the output of the alignment circuit that is configured to cause the gating circuit to inhibit the third clock signal; and
a second set of circuits coupled to the gating circuit to receive the third clock signal.

9. The integrated circuit device of claim 8, wherein:
the alignment circuit is configured to determine whether to provide the enable signal such that the third clock signal is inhibited based on whether the intermediate clock signal transitions between based on the second clock signal and being based on the first clock signal.

10. The integrated circuit device of claim 9, wherein the alignment circuit is configured such that:
the enable signal inhibits the third clock signal based on the intermediate clock signal transitioning between based on the second clock signal and being based on the first clock signal; and
the enable signal does not inhibit the third clock signal based on the intermediate clock signal transitioning between based on the first clock signal and being based on the second clock signal.

11. The integrated circuit device of claim 9, wherein the alignment circuit is configured to continue to provide the enable signal such that the third clock signal is inhibited until the intermediate clock signal transitions with the first clock signal.

12. The integrated circuit device of claim 8, wherein the alignment circuit is configured to determine whether to provide the enable signal such that the third clock signal is inhibited based on the selection signal.

13. The integrated circuit device of claim 8, wherein each circuit of the second set of circuit includes a respective local clock divider configured to produce a respective local clock based on the third clock signal.

14. The integrated circuit device of claim 13, wherein:
the alignment circuit includes a timer circuit configured to produce an alignment pulse at an interval based on the respective local clock of each circuit of the second set of circuits; and
the alignment circuit is configured to determine whether to cease providing the enable signal such that the third clock signal is inhibited based on the alignment pulse.

15. A method comprising:
receiving a first clock signal, a second clock signal, and a selection signal;
selecting, based on the selection signal, between providing a third clock signal based on the first clock signal and providing the third clock signal based on the second clock signal;
detecting whether the third clock signal has changed between being based on the second clock signal and being based on the first clock signal; and
determining whether to inhibit a set of transitions in the third clock signal based on whether the third clock signal has changed between being based on the second clock signal and being based on the first clock signal.

16. The method of claim 15, further comprising:
inhibiting the set of transitions in the third clock signal using a gating circuit; and
ceasing to inhibit the third clock signal based on the first clock signal being stable at an input of the gating circuit.

17. The method of claim 16, wherein:
the third clock signal is provided to a set of circuits that are each associated with a respective local clock; and
the ceasing to inhibit the third clock signal is performed at a time determined based on the respective local clocks of the set of circuits.

18. The method of claim 16, wherein:
the third clock signal is provided to a set of circuits; and
the method further comprises providing a reset signal to the set of circuits between the inhibiting of the set of transitions in the third clock signal and the ceasing to inhibit the third clock signal.

19. The method of claim 15, wherein the detecting of whether the third clock signal has changed between being based on the second clock signal and being based on the first clock signal is based on the selection signal.

* * * * *